United States Patent
Yu et al.

(10) Patent No.: US 7,442,589 B2
(45) Date of Patent: Oct. 28, 2008

(54) SYSTEM AND METHOD FOR UNIFORM MULTI-PLANE SILICON OXIDE LAYER FORMATION FOR OPTICAL APPLICATIONS

(75) Inventors: Lianzhong Yu, Redmond, WA (US); Ken L. Yang, Bellevue, WA (US); Thomas Keyser, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 214 days.

(21) Appl. No.: 11/306,952

(22) Filed: Jan. 17, 2006

(65) Prior Publication Data

US 2007/0167027 A1 Jul. 19, 2007

(51) Int. Cl.
*H01L 21/337* (2006.01)

(52) U.S. Cl. ............ 438/150; 438/168; 438/187; 438/424; 257/E33.003; 257/E31.04; 257/E29.003; 257/E21.121; 257/E21.123

(58) Field of Classification Search ......... 438/168, 438/187, 424, 427, 243, 150; 257/E33.003, 257/E31.04, E29.003, E21.121, E21.123
See application file for complete search history.

(56) References Cited

U.S. PATENT DOCUMENTS

| | | | |
|---|---|---|---|
| 5,383,048 A | | 1/1995 | Seaver |
| 5,500,544 A | | 3/1996 | Park et al. |
| 5,696,662 A | | 12/1997 | Bauhahn |
| 6,108,212 A | | 8/2000 | Lach et al. |
| 6,156,620 A | * | 12/2000 | Puchner et al. ............ 438/400 |
| 6,472,301 B1 | * | 10/2002 | Lin et al. ............ 438/524 |
| 6,493,502 B1 | | 12/2002 | Deliwala |
| 6,526,187 B1 | | 2/2003 | Deliwala |
| 6,546,538 B1 | | 4/2003 | Rubdi et al. |
| 6,603,889 B2 | | 8/2003 | Deliwala |
| 6,608,945 B2 | | 8/2003 | Deliwala |
| 6,611,636 B2 | | 8/2003 | Deliwala |
| 6,625,348 B2 | | 9/2003 | Deliwala |
| 6,646,747 B2 | | 11/2003 | Deliwala |

(Continued)

FOREIGN PATENT DOCUMENTS

WO WO03077015 A1 9/2003

OTHER PUBLICATIONS

Ansheng Liu, et al., A high-speed silicon optical modulator based on a metal-oxide-seminconducter capacitor; Nature Publishing Group, 2004, pp. 615-618; Santa Clara, California.

*Primary Examiner*—Michael Lebentritt
*Assistant Examiner*—Chakila Tillie
(74) *Attorney, Agent, or Firm*—McDonnell Boehnen Hulbert & Berghoff LLP

(57) ABSTRACT

Methods and systems for growing uniform oxide layers include an example method including growing a first layer of oxide on first and second facets of the substrate, with the first facet having a faster oxide growth rate. The oxide is removed from the first facet and a second oxide layer is grown on the first and second facets. Removing the oxide from the first facet includes shielding the second facet and exposing the substrate to a deoxidizing condition. The second facet is then exposed to receive the second oxide layer. Areas having differing oxide thicknesses are also grown by repeatedly growing oxide layers, selectively shielding areas, and removing oxide from exposed areas.

13 Claims, 12 Drawing Sheets

U.S. PATENT DOCUMENTS

| | | | |
|---|---|---|---|
| 6,654,511 B2 | 11/2003 | Deliwala | |
| 6,658,173 B2 | 12/2003 | Delwala | |
| 6,671,443 B2 | 12/2003 | Deliwala | |
| 6,690,844 B2 | 2/2004 | Deliwala | |
| 6,690,863 B2 | 2/2004 | Deliwala | |
| 6,727,158 B2 * | 4/2004 | Sundt et al. | 438/424 |
| 6,738,546 B2 | 5/2004 | Deliwala | |
| 6,748,125 B2 | 6/2004 | Deliwala | |
| 6,760,498 B2 | 7/2004 | Delwala | |
| 6,821,851 B2 * | 11/2004 | Hergenrother et al. | 438/268 |
| 6,823,112 B2 | 11/2004 | Deliwala | |
| 6,826,320 B2 | 11/2004 | Deliwala | |
| 6,842,546 B2 | 1/2005 | Deliwala | |
| 6,845,198 B2 | 1/2005 | Montgomery et al. | |
| 6,869,881 B2 | 3/2005 | Deliwala | |
| 6,879,751 B2 | 4/2005 | Deliwala | |
| 6,891,685 B2 | 5/2005 | Deliwala et al. | |
| 6,891,985 B2 | 5/2005 | Delwala | |
| 6,895,136 B2 | 5/2005 | Deliwala | |
| 6,897,498 B2 | 5/2005 | Gothoskar et al. | |
| 6,898,352 B2 | 5/2005 | Deliwala | |
| 6,912,330 B2 | 6/2005 | Deliwala | |
| 6,917,730 B2 | 7/2005 | Ghiron et al. | |
| 6,934,444 B2 | 8/2005 | Ghiron et al. | |
| 6,944,369 B2 | 9/2005 | Deliwala | |
| 6,947,615 B2 | 9/2005 | Deliwala | |
| 6,963,118 B2 | 11/2005 | Deliwala et al. | |
| 6,968,110 B2 | 11/2005 | Patel et al. | |
| 6,980,720 B2 | 12/2005 | Gothoskar et al. | |
| 6,987,910 B2 | 1/2006 | Shappir et al. | |
| 6,993,225 B2 | 1/2006 | Patel et al. | |
| 6,993,243 B2 | 1/2006 | Delwala | |
| 7,000,207 B2 | 2/2006 | Gothoskar et al. | |
| 7,013,067 B2 | 3/2006 | Ghiron et al. | |
| 7,020,364 B2 | 3/2006 | Ghiron et al. | |
| 7,176,138 B2 * | 2/2007 | Chen et al. | 438/700 |
| 2003/0054639 A1 | 3/2003 | Deliwala | |
| 2004/0190826 A1 | 9/2004 | Ghiron et al. | |
| 2004/0223768 A1 | 11/2004 | Shastri et al. | |
| 2004/0240822 A1 | 12/2004 | Patel et al. | |
| 2004/0258347 A1 | 12/2004 | Gothoskar et al. | |
| 2005/0094938 A1 | 5/2005 | Ghiron et al. | |
| 2005/0094939 A1 | 5/2005 | Ghiron et al. | |
| 2005/0110108 A1 | 5/2005 | Patel et al. | |
| 2005/0123232 A1 | 6/2005 | Piede et al. | |
| 2005/0135727 A1 | 6/2005 | Piede et al. | |
| 2005/0179986 A1 | 8/2005 | Gothoskar et al. | |
| 2005/0189591 A1 | 9/2005 | Gothoskar et al. | |
| 2005/0194990 A1 | 9/2005 | Gothoskar et al. | |
| 2005/0201683 A1 | 9/2005 | Ghiron et al. | |
| 2005/0213873 A1 | 9/2005 | Piede et al. | |
| 2005/0220405 A1 | 10/2005 | Shappir et al. | |
| 2005/0236619 A1 | 10/2005 | Patel et al. | |
| 2005/0289490 A1 | 12/2005 | Shastri et al. | |
| 2006/0018597 A1 | 1/2006 | Piede et al. | |
| 2006/0083144 A1 | 4/2006 | David et al. | |

* cited by examiner

SYSTEM AND METHOD FOR UNIFORM MULTI-PLANE SILICON OXIDE LAYER FORMATION FOR OPTICAL APPLICATIONS

BACKGROUND OF THE INVENTION

Silicon has increasingly been used in optical applications. Currently such optical components as waveguides, beam splitters, detectors, lasers, and the like can all be formed in silicon. Forming such components from silicon enables small high frequency response, lower energy components as well as large scale manufacturing using semiconductor fabrication methods.

Recently, thin silicon oxide layers have been grown on silicon components to form antireflective coatings on silicon in order to achieve a desired light path. In order to function properly, antireflective coatings must have a thickness matched to the wavelength of light used in the optical system. Any variation in the thickness of the antireflective coating can introduce unwanted reflections, attenuation, and other irregularities. Inasmuch as the optical spectrum is from 400 to 700 nanometers, achieving a specified antireflective coating requires extremely accurate manufacturing processes.

Silicon is a face centered cubic (FCC) crystal structure having 100, 110, and 111 plans, and permutations thereof. In the presence of oxygen, oxide layers will grow on facets parallel to the 100 and 111 planes at different rates. Accordingly, two facets on the same substrate that are parallel to the 100 and 111 planes, respectively, will have oxide layers of different thicknesses after having been exposed to oxygen for the same period of time. As a result, the facets will not bear oxide layers suitable for suppressing reflection of light at the same wavelength.

For example, FIG. 1 illustrates a substrate 10 having a faceted upper surface having facets 12a-12c parallel to the 100 plane 14 of the silicon substrate and facets 16a, 16b parallel to the 111 plane 18. For purposes of the disclosure the 100 plane 14 may mean any of the permutations of the 100 planes of an FCC material including the 100, 010, and 001 planes. Other facets formed on the substrate 10 may be parallel to the 110 plane and the 101 and 011 permutations thereof.

The substrate 10 is exposed to an oxidizing environment such that an oxide layer 20 is grown on the silicon substrate 10 will have a thickness 22 on facets 12a-12c that is less than a thickness 24 on facets 16a, 16b due to the faster growth rate of the 111 plane 18. Oxide layers grown on the 110 plane may likewise have a thickness different than the thicknesses 22, 24.

In view of the foregoing it would be an advancement in the art to provide a system and method for growing uniform oxide layers over both the 100 and 111 planes. Such a system and method should be capable of use in large scale manufacturing of silicon optical components.

BRIEF SUMMARY OF THE INVENTION

The present invention includes methods and systems for growing uniform oxide layers evenly over a silicon substrate. One method includes growing a first layer of oxide on first and second facets of the substrate, with the first facet having a faster oxide growth rate. The oxide is then removed from the first facet and a second oxide layer is grown on the first and second facets. Removing the oxide from the first facet includes shielding the second facet and exposing the substrate to a condition suitable for removing the oxide layer, such as a wet etching process. The second facet is then exposed to receive and a second oxide layer is grown on the first and second facets. Shielding the second facet includes applying a photoresist to the substrate and removing the photoresist from the first facet. Shielding may also include selectively metallizing the second facet.

Growing the first and second oxide layers includes exposing the silicon substrate to an oxidizing environment for first and second periods, respectively. The first period has a duration sufficient to grow oxide having a thickness about equal to $S*(1-X/Y)$, where S is a final thickness of oxide grown on the second facet for a total period about equal to a sum of the first and second periods, X is a first growth rate for the second facet, and Y is a second growth rate of the first facet.

BRIEF DESCRIPTION OF THE SEVERAL VIEWS OF THE DRAWING

The preferred and alternative embodiments of the present invention are described in detail below with reference to the following drawings.

DETAILED DESCRIPTION OF THE INVENTION

Figure 2:
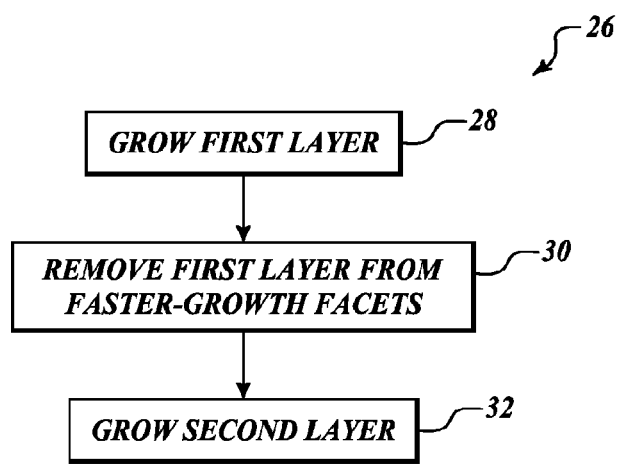
FIG. 2 is process flow diagram of a method for uniform oxide layer formation, in accordance with an embodiment of the present invention.
Figure 3:
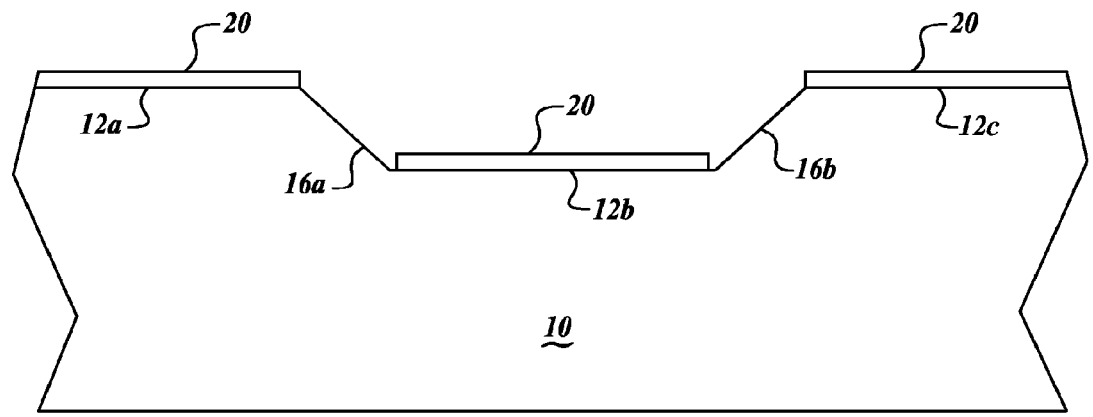
FIG. 3 is a side cross-section view of the silicon substrate having portions of the oxide layer selectively removed from faster-growth facets, in accordance with an embodiment of the present invention
Figure 4:
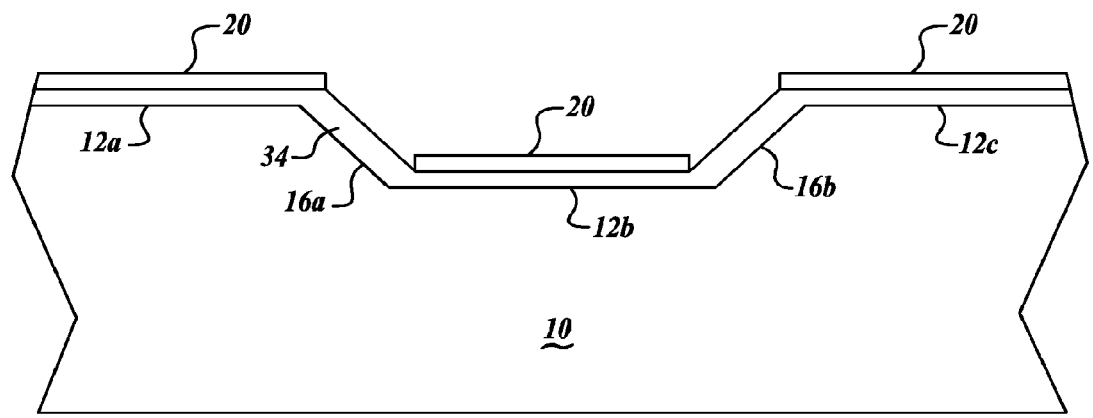
FIG. 4 is a side cross-section view of the silicon substrate having a second oxide layer formed thereon, in accordance with an embodiment of the present invention.

FIGS. 2 through 4 illustrate a method 26 for growing a uniform layer on a substrate notwithstanding the differences in growth rates. At block 28 a first layer, such as an oxide layer 20, is grown on the substrate 10. At block 30, the layer is removed from faster-growth facets, such as facets 16a, 16b, as shown in FIG. 3. Removing the layer from the faster-growth facets 16a, 16b may include removing the first silicon oxide layer 20 by means of a wet-etching process, or other such process.

At block 32, a second oxide layer 34 is grown in addition to the first oxide layer 16, as shown in FIG. 4. Oxidation in silicon proceeds inwardly into the bulk of the substrate. Accordingly, the second oxide layer 34 formed at block 32 is below the first oxide layer 20. In other applications of the present invention, layers are deposited on the substrate 10 which are deposited at different rates over different planes. In such embodiments, the oxide layer 34 will be above the layer 16.

The method 26 illustrated in FIGS. 2 through 4 provides a means for equalizing growth rates across the slower-growth facets 12a-12c and the faster growth facets 16a, 16b. In one embodiment, a uniform layer thickness across multiple planes is achieved by adjusting the thickness of the first oxide layer 16. The first oxide layer has a thickness $T_1$ equal to the equation $S*(1-X/Y)$, where S is the combined thickness of the first oxide layer 20 and the second oxide layer 34, X is the slower growth rate, such as on the 100 plane 14, and Y is the faster growth rate, such as on the 111 plane 18. The second oxide layer 34 has a thickness $T_2$ equal to $S-T_1$.

The thicknesses of the first oxide layer 20 and second oxide layer 34 may be controlled by adjusting the length of time that the substrate 10 is subject to an oxidizing environment. Accordingly, the first oxide layer 20 may be formed by exposing the substrate 10 to the oxidizing environment for a first period $t_1$ whereas the second oxide layer 34 is formed by exposing the substrate 10 to the oxidizing environment for a second period $t_2$. The ratio of the second period relative to the sum of the first and second period $(t_2/(t_1+t_2))$ will be equal to X/Y in order to achieve a uniform thickness.

Figure 5:
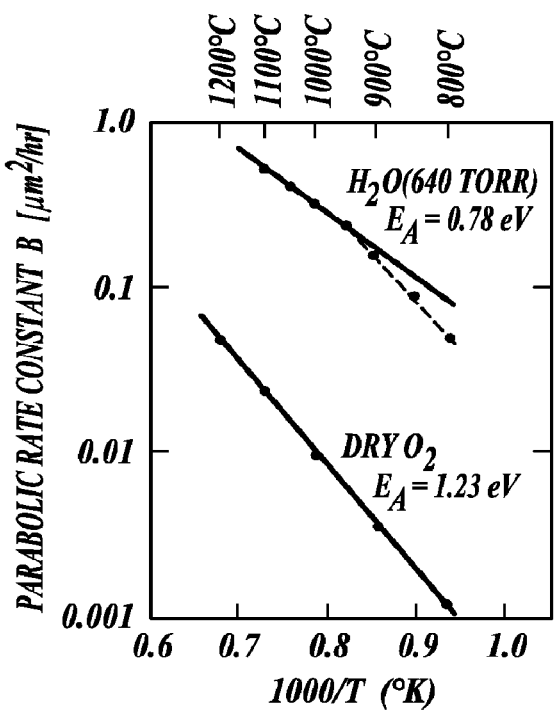
FIG. 5 is a chart of values for a parabolic rate constant B used to calculate oxide growth times, in accordance with an embodiment of the present invention.
Figure 6:
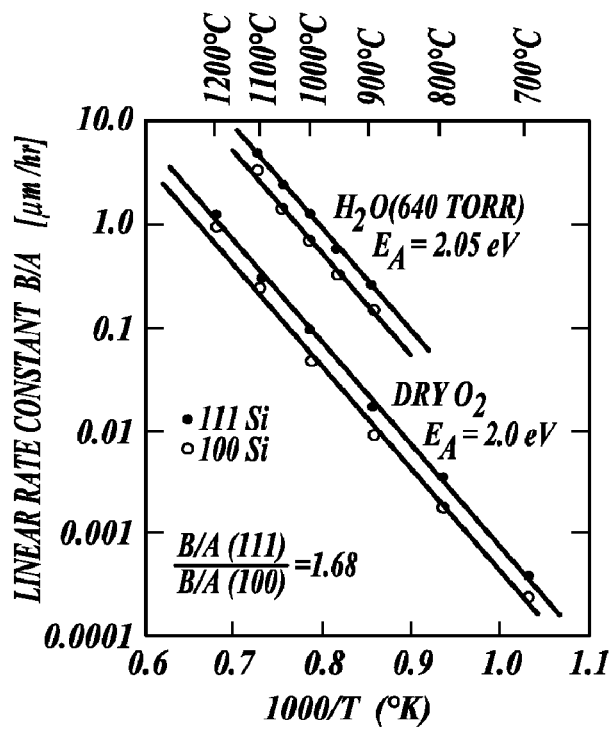
FIG. 6 is a chart of values for a linear rate constant B/A used to calculate oxide growth times, in accordance with an embodiment of the present invention.

For oxide layers having large thickness, such as above 5,000 Angstroms, the rate of oxide layer growth becomes significantly non-linear. Accordingly, the first and second periods may be adjusted to accommodate this nonlinearity. Equation 1 accommodates nonlinearity in oxide growth rates. A description of nonlinearity in silicon-oxide growth rates may be found in "Semiconductor Materials and Process Technology Handbook for Very Large Scale Integration and Ultra Large Scale Integration" (ed. Gary E. McGuire, Noyes Publications, Park Ridge, N.J.).

$$t = \frac{x_o^2 - x_i^2}{B} + \frac{x_o - x_i}{\frac{B}{A}} \quad \text{Equation 1:}$$

Where t is the time required to form an oxide layer of thickness $x_O$ over a silicon substrate bearing an oxide layer having a thickness $x_i$. B is a parabaolic rate constant and B/A is a linear rate constant used to describe oxide growth. B and B/A are calculated according to Equations 2 and 3 or Equations 4 and 5. Alternatively, B and B/A may be determined by referencing measured values illustrated in FIGS. 5 and 6.

$$A = 2D_{\textit{eff}}\left(\frac{1}{k} + \frac{1}{h}\right) \quad \text{Equation 2:}$$

$$B = 2D_{\textit{eff}}\frac{C^k}{N_1} \quad \text{Equation 3:}$$

Where $D_{\textit{eff}}$ is the effective oxidant diffusion constant in oxide, k and h are rate constants at the Si—SiO$_2$ and gas-oxide interfaces, $C^k$ is an equilibrium concentration of the oxide species in the oxide, $N_1$ is the number of oxidant molecules in the oxide unit volume.

$$B = C_1 e^{\frac{E_1}{kT}} \quad \text{Equation 4:}$$

$$\frac{B}{A} = C_2 e^{\frac{E_2}{kT}} \quad \text{Equation 5:}$$

Where T is the temperature at which the oxidation takes place expressed in degrees Kelvin and k is a rate constant at the Si—SiO$_2$ and gas oxide interfaces.

For the 111 plane of silicon under dry oxidation conditions $$C_1 = 7.72 \times 10^2 \frac{\mu m^2}{hr}, C_2 = 6.23 \times 10^6 \frac{\mu m^2}{hr}, E_1 = 1.23\text{eV}, E_2 = 2.0\text{eV}.$$

For the 111 plane of silicon under wet oxidation conditions $$C_1 = 3.68 \times 10^2 \frac{\mu m^2}{hr}, C_2 = 1.63 \times 10^8 \frac{\mu m^2}{hr}, E_1 = 0.78\text{eV}, E_2 = 2.05\text{eV}.$$

For the 100 plane of silicon $$C_{2(100)} = \frac{C_{2(111)}}{1.7}.$$

In one embodiment of the method 26 the Equation 1 is used to calculate a time $t_1$ used at block 28 for the duration of oxide growth during formation of the first oxide layer 20, such that when the second oxide layer 34 is grown thereunder at block 34 for a time $t_2$ all facets 12a-12c and facets 16a, 16b will have substantially uniform thickness. The thickness of the first oxide layer 20 grown on the slower-growth facets 12a-12c is used as $x_i$ in Equation 1 as applied to the slower growth facets 12a-12c to determine a time $t_2$ for oxide growth forming the second oxide layer 34 at block 32. Equation 1 is used to calculates a time $t_2$ for growing a second oxide layer at block 32 such that the thickness $x_0$ on the faster growth planes 16a, 16b and the thickness $x_0$ on the slower growth planes 12a-12c bearing the first oxide layer 20 of thickness $x_i$ are equal to one another at a desired thickness.

For example, to achieve a thickness of about 10,150 Angstroms on both the slower growth facets 12a-12c and the faster growth facets 16a, 16b for a wet oxidation process carried out at 900° C., $t_1$ is equal to about 2.8 hours and $t_2$ is equal to about 10 hours.

Figure 1:
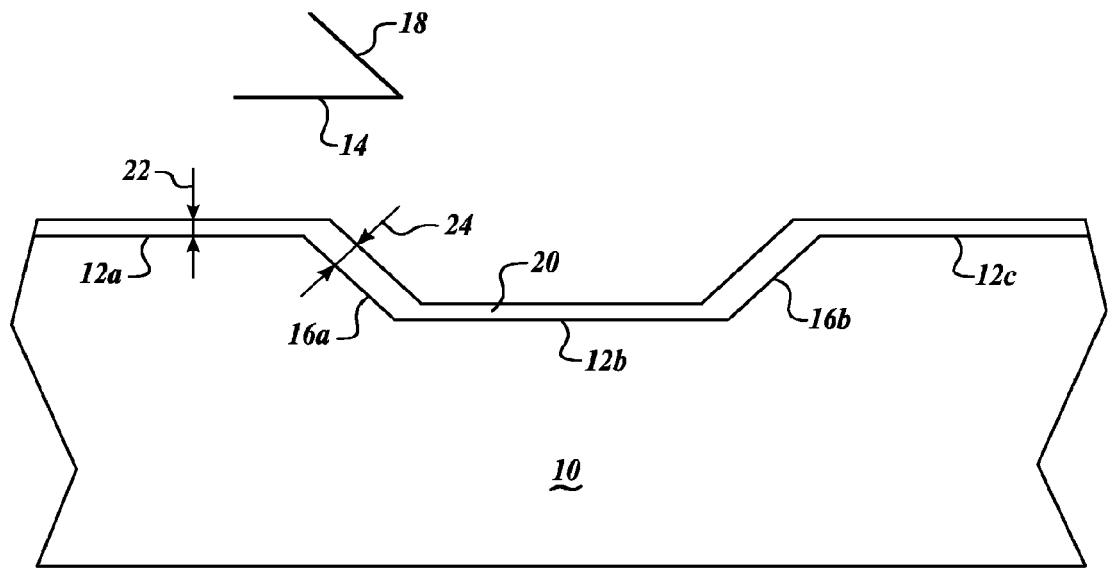
FIG. 1 is side cross-section view of a silicon substrate having multiple facets and an oxide layer formed thereon.
Figure 7:
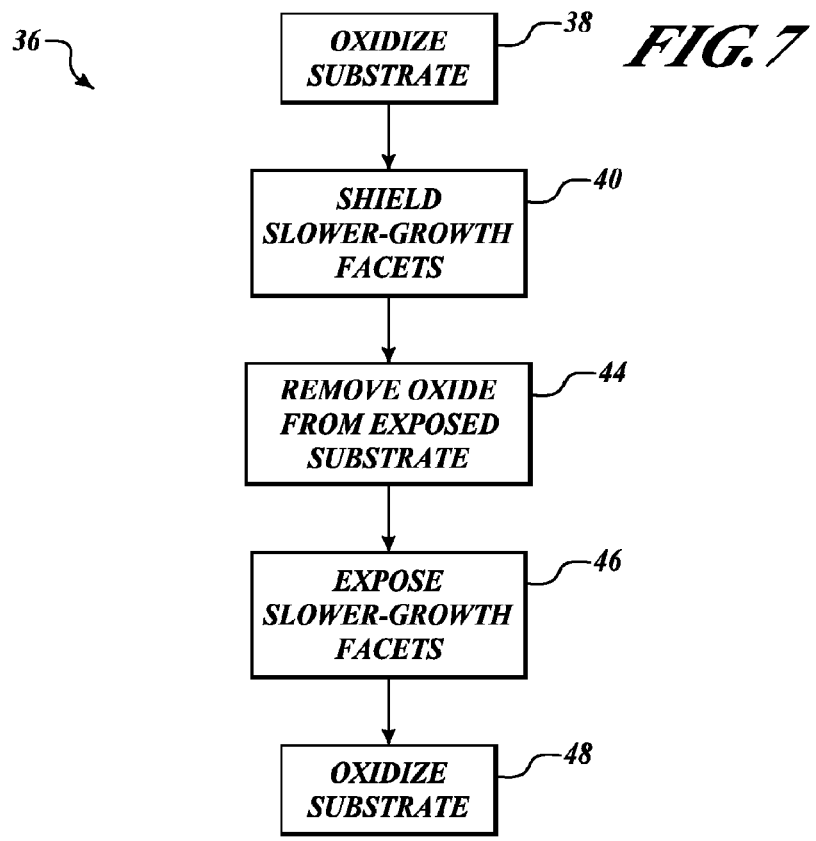
FIG. 7 is a process flow diagram of an alternative method for uniform oxide layer formation, in accordance with an embodiment of the present invention.
Figure 8:
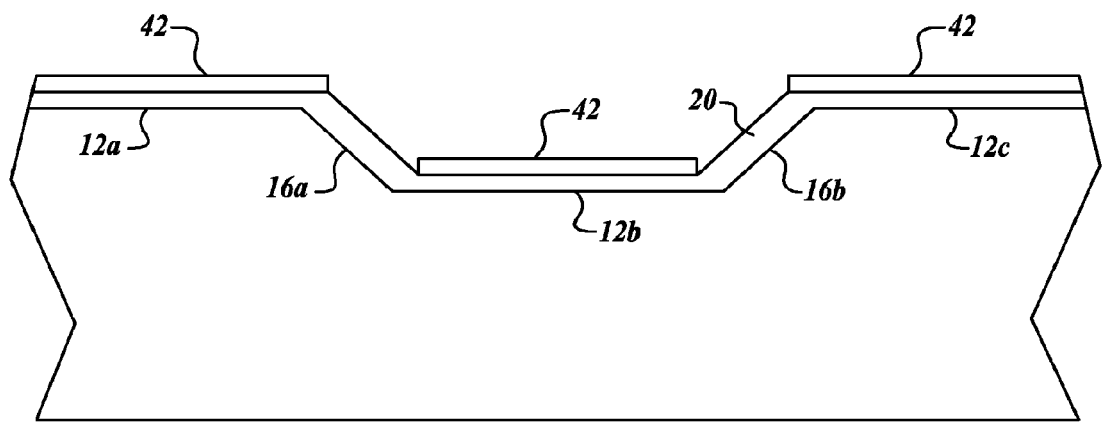
FIG. 8 is a side cross-section view of the silicon substrate having shielded slower-growth portions, in accordance with an embodiment of the present invention.

FIGS. 7 and 8 illustrate a method 36 which is an alternative embodiment of the method 26 for uniform layer formation. In the method 36, the substrate 10 is oxidized at block 38 by exposing the substrate to an oxidizing environment to yield a first layer, as in FIG. 1. The oxidizing environment may include the presence of oxygen at an elevated temperature. At block 40, the slower growth facets are shielded, such as by a shielding layer 42 shown in FIG. 8. The shielding layer 42 may be a layer of photoresist, metal, or the like. The oxide is removed from the faster growth facets 16a, 16b at block 44, as shown in FIG. 3. The shielding layer 42 is then removed at block 46 to expose the slower-growth facets 12a-12c and the substrate 10 is again oxidized at block 48 to yield the uniform thickness layer of FIG. 4.

In order to achieve oxide thicknesses varying locally the first oxide layer 20 is removed in areas where the oxide layer is to be thinner. The steps of oxidizing, shielding, and locally removing oxide, exposing, and oxidizing again may be repeated, selectively shielding different portions each iteration to achieve oxide layers having a broad range of thicknesses on a single substrate 10.

Figure 9:
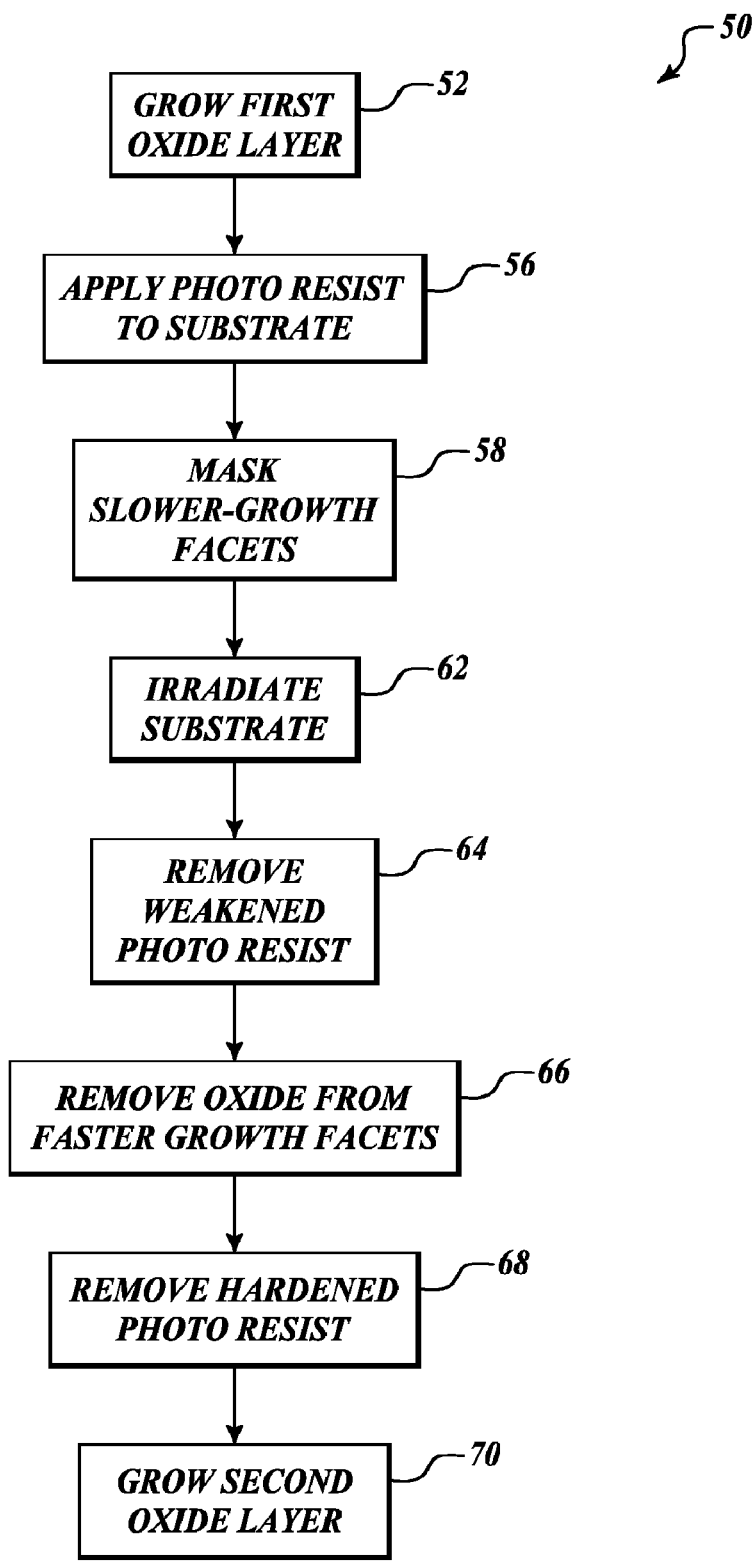
FIG. 9 is a process flow diagram of an alternative method for uniform oxide layer formation, in accordance with an embodiment of the present invention.
Figure 10:
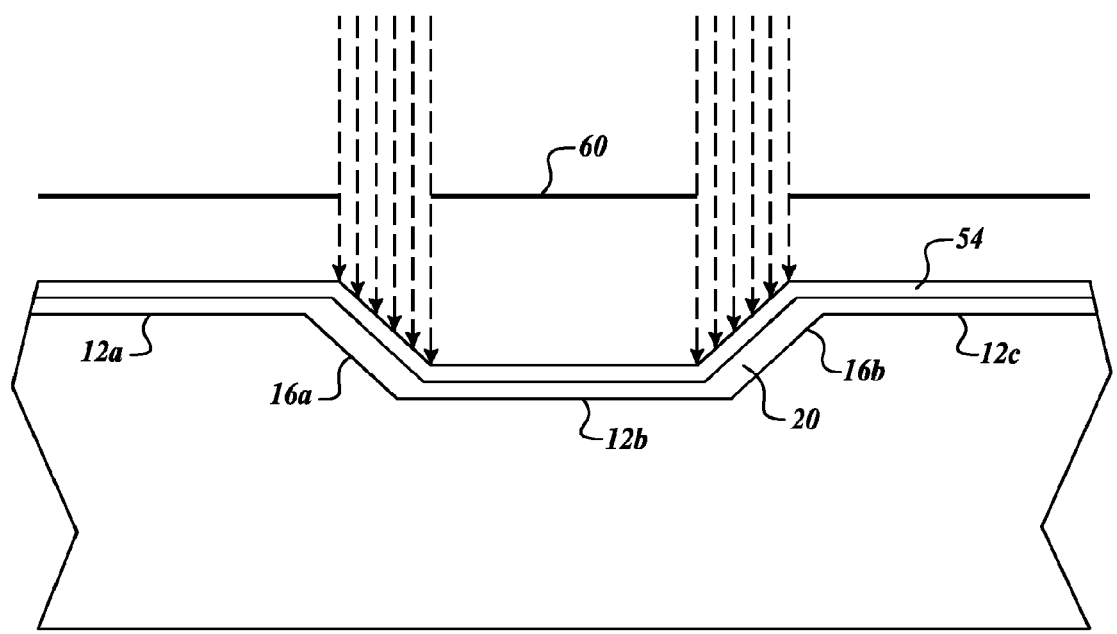
FIG. 10 is a side cross-section view of the silicon substrate having a photoresist layer being irradiated through a mask exposing faster-growth facets, in accordance with an embodiment of the present invention.

FIGS. 9 and 10 illustrate a method 50 that is an alternative embodiment of the method 36. In the method 50, a first oxide layer 20 is grown on the substrate at block 52. A photoresist layer 54 is then applied at block 56. The slower-growth facets 12a-12c are masked at block 58, such as by a mask 60 interposed between the substrate 10 and a light source. The substrate 10 is then irradiated through the mask 60 at block 62. For positive photoresist, exposing the photoresist to light weakens the photo resist, making it readily removable. The steps recited for blocks 56, 58, 62 assume use of a positive photoresist compound that is weakened by exposure to light. Other embodiments may use a negative photoresist compound that remains in a weakened state unless hardened by exposure to light. In such embodiments, the faster-growth facets 16a, 16b are masked in order to weaken the photoresist coating them.

For both types of photoresist, the weakened photoresist is then removed at block 64 to expose the faster-growth facets 16a, 16b. The oxide on the faster-growth facets 16a, 16b is then removed at block 66. The hardened photoresist is removed at block 68 and a second oxide layer 34 is grown at block 70.

Figure 11:
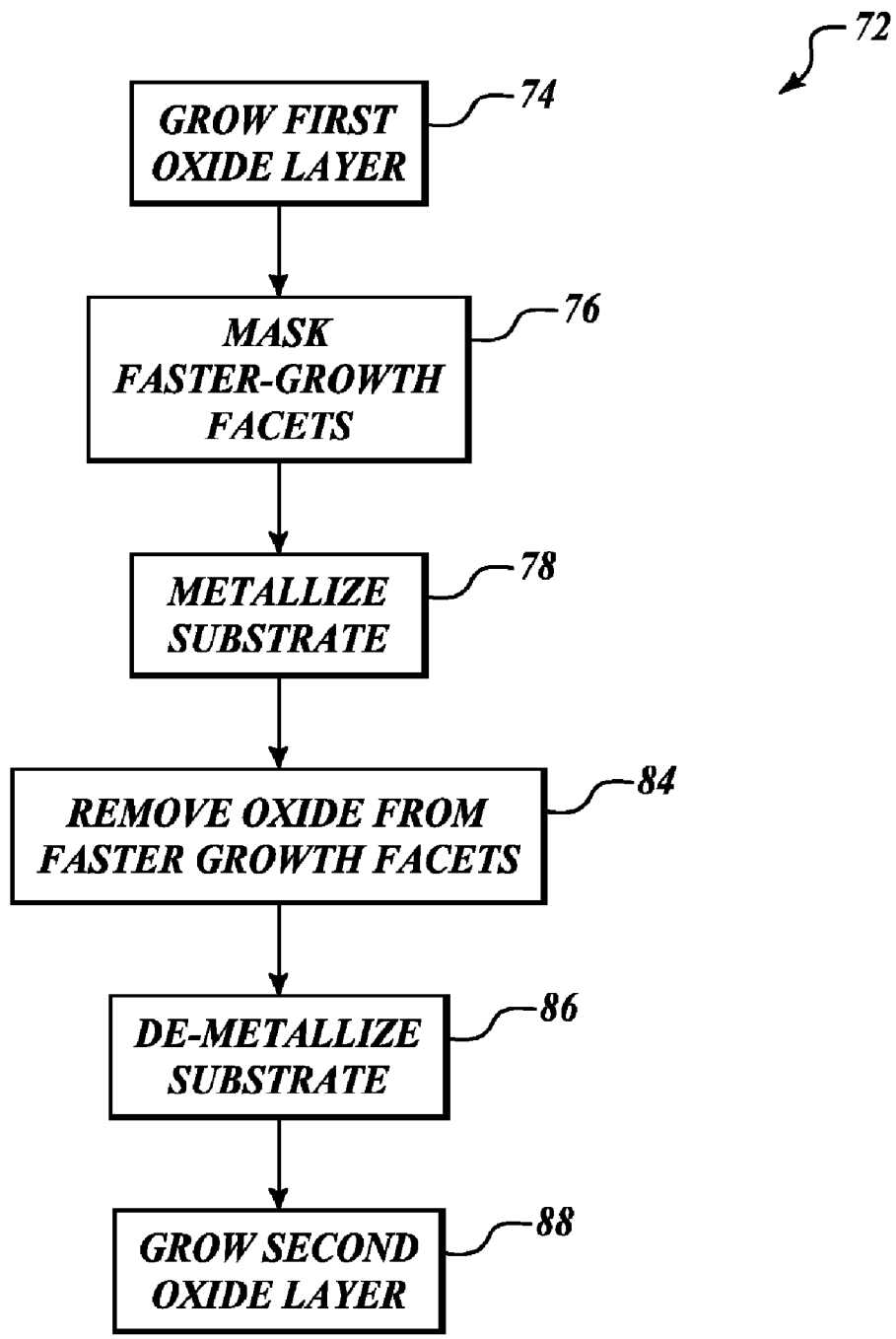
FIG. 11 is a process flow diagram of an alternative method for uniform oxide layer formation, in accordance with an embodiment of the invention.
Figure 12:
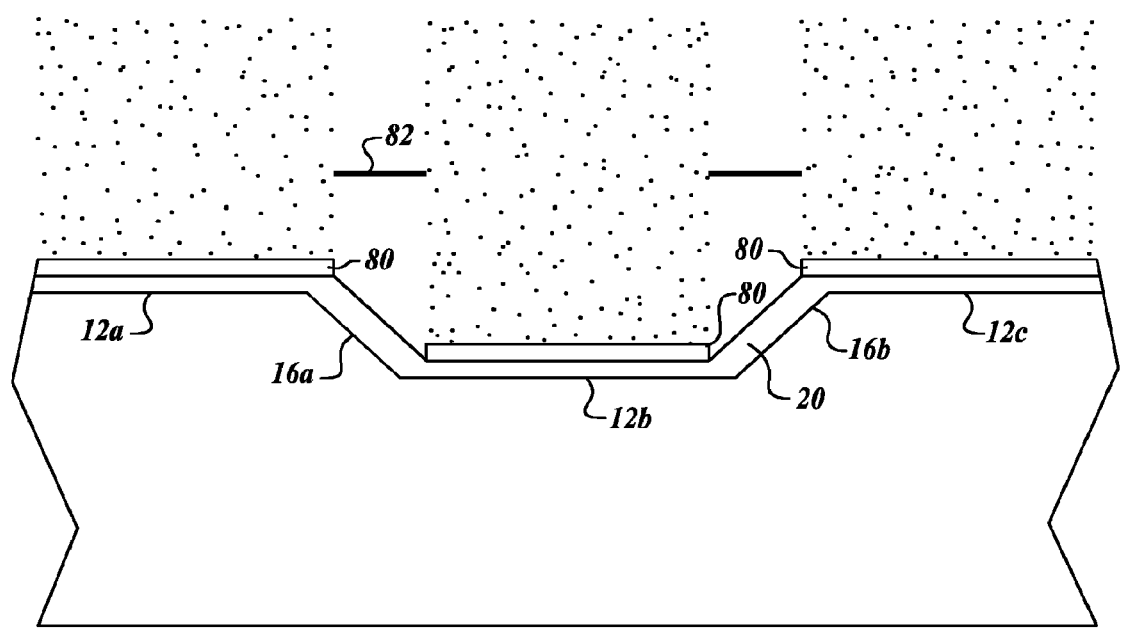
FIG. 12 is a side cross-section view of the silicon substrate being metallized through a mask exposing slower-growth facets, in accordance with an embodiment of the present invention.

FIGS. 11 and 12 illustrate a method 72 that is an alternative embodiment of the method 36. In the method 72, the first oxide layer 20 is grown at block 74. The faster growing facets are then masked at block 76. The exposed areas of the substrate 10 are then metallized at block 78 to create a metal layer 80 over the slow-growth facets as shown in FIG. 12. Metallization at block 78 may be accomplished by E-beam evaporation, sputtering, chemical vapor deposition (CVD), or the like, through a mask 82 exposing the slower-growth facets 12a-12c. Oxide is removed from the unmetalized, faster-growth facets 16a, 16b at block 84 by plasma etching, wet etching, or the like chosen such that the metal layer 80 is not removed thereby. The metal layer 80 is then removed at block 86, such as by wet chemical etching, and a second oxide layer is grown at block 88.

Figure 13:
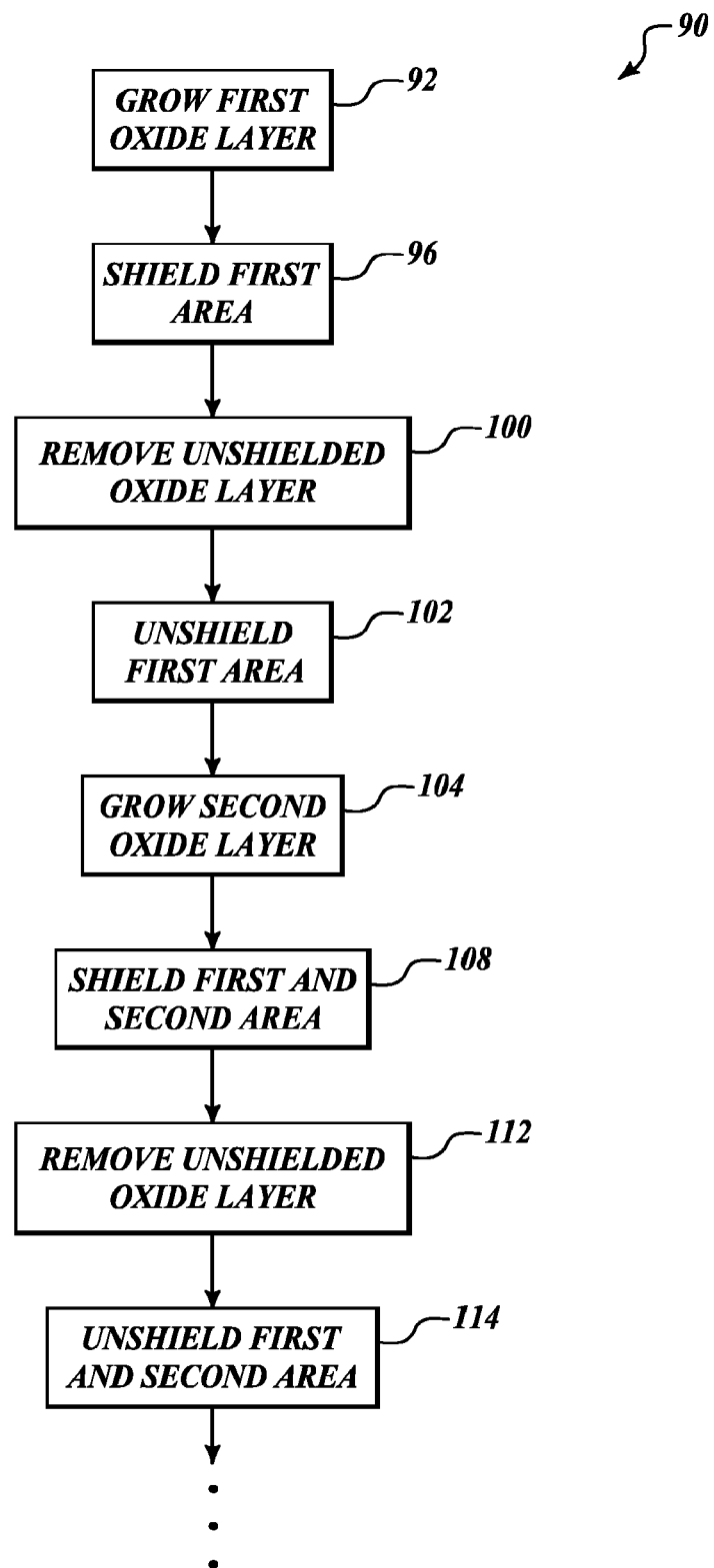
FIG. 13 is process flow diagram of a method for growing multiple-thickness oxide layers, in accordance with an embodiment of the present invention.
Figure 14A:
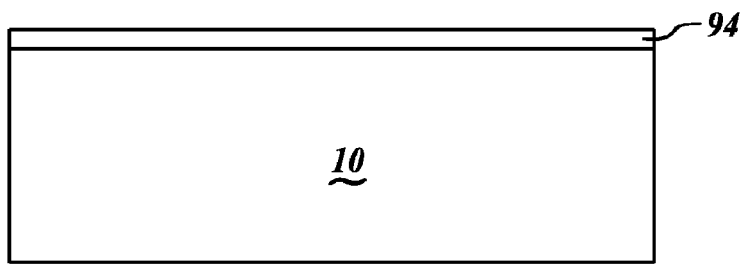
FIG. 14A-14D are side cross-section views of the silicon substrate undergoing the method of FIG. 13, in accordance with an embodiment of the present invention.
Figure 14B:
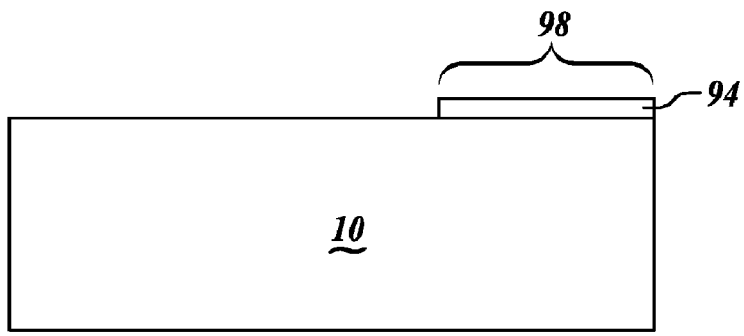
Figure 14C:
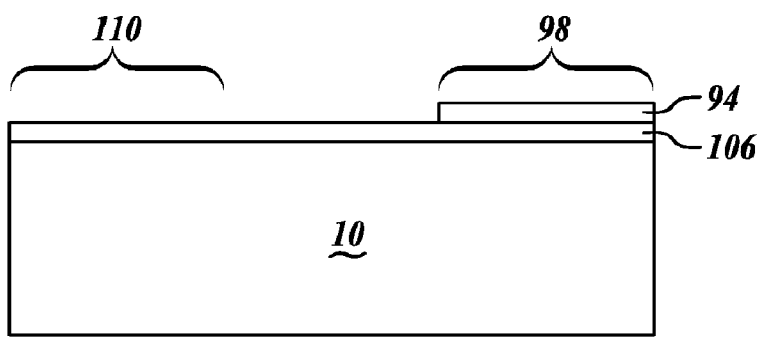
Figure 14D:
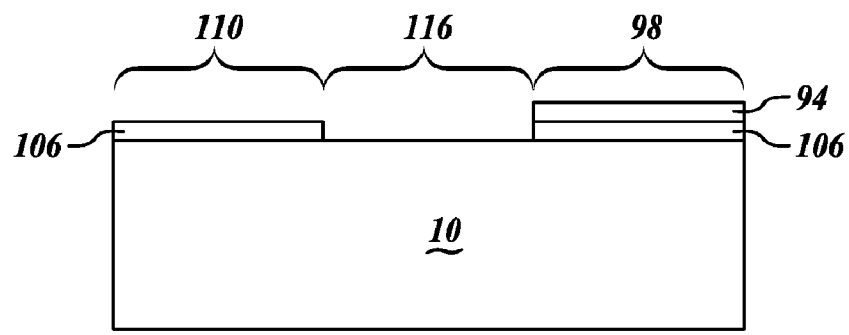

FIG. 13 illustrates a method 90 for forming oxide layers having locally varying thicknesses according to a specific criteria, rather than uniform layers. At block 92 a first oxide layer 94 is formed, as illustrated in FIG. 14A. At block 96 a first area 98 is shielded and the oxide in unshielded areas is removed at block 100, leaving the substrate 10 as illustrated in FIG. 14B. At block 102, shielding is removed and at block 104, a second oxide layer 106 is grown, as illustrated in FIG. 14C. At block 108, the first area 98 an a second area 110 are shielded and at block 112, the oxide layer is removed from unshielded areas of the substrate 10. At block 114, the first and second areas are unshielded, leaving the substrate as shown in FIG. 14D having a first area 98, a second area 108, and a third area 116 each having a unique oxide layer thickness. The method 90 of FIG. 13 may use any of the methods 32, 50, 72 for shielding areas of the substrate during removal of the oxide layer.

Figure 15:
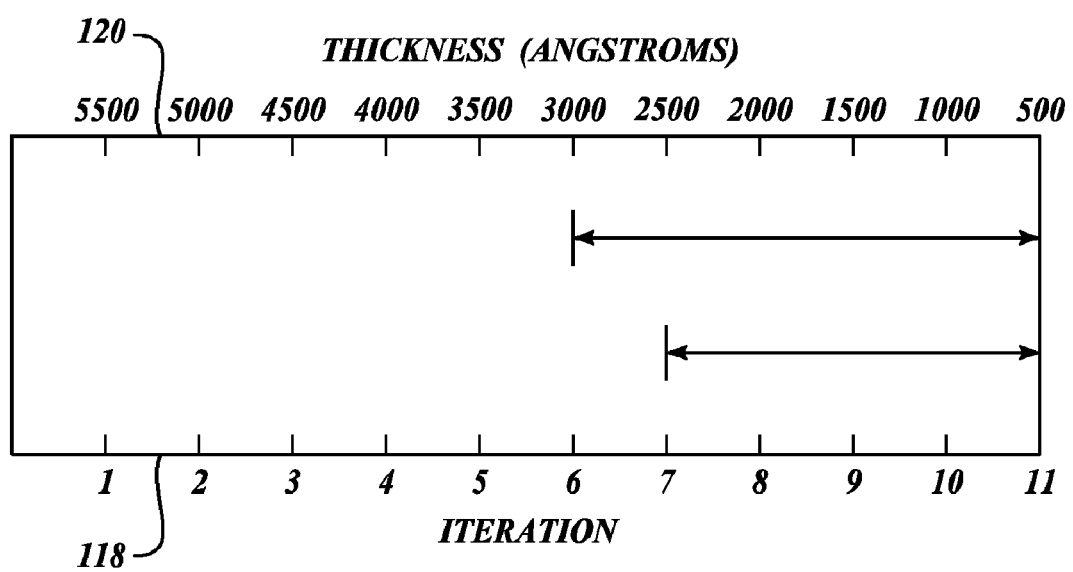
FIG. 15 is a plot illustrating a means for timing shielding application in order to achieve a specific oxide layer thickness, in accordance with an embodiment of the present invention.

Referring to FIG. 15, the pattern illustrated in FIGS. 13 and 14A-14D may be repeated for any number of oxide layers and areas. For example, a manufacturing process includes multiple iterations of the process including the steps of growing an oxide layer, shielding certain areas, and removing unshielded portions of the oxide layer. The lower axis 118 of FIG. 15 indicates the number of the iteration and the upper axis 122 indicates the thickness of the oxide layer. In order to achieve an area having a desired oxide layer thickness, one first determines the thickness of the area having the thickest oxide layer and performs sufficient iterations to achieve the desired thickness, 5,500 Angstroms in the illustrated scenario. Areas to have the greatest thickness will be shielded during each iteration. Areas to have a lesser thickness are left unshielded during initial iterations until the number of remaining iterations is sufficient to grow an oxide layer of the appropriate thickness. The lesser-thickness area is then shielded for all remaining iterations. For example, an area may begin to be shielded during oxide layer removal at iteration six in order to achieve an oxide layer thickness of 3000 Angstroms, whereas another area begins to be shielded at iteration seven in order to achieve an oxide layer thickness of 2500 Angstroms. Areas where no oxide layer is to be formed are left unshielded for all iterations.

Figure 16:
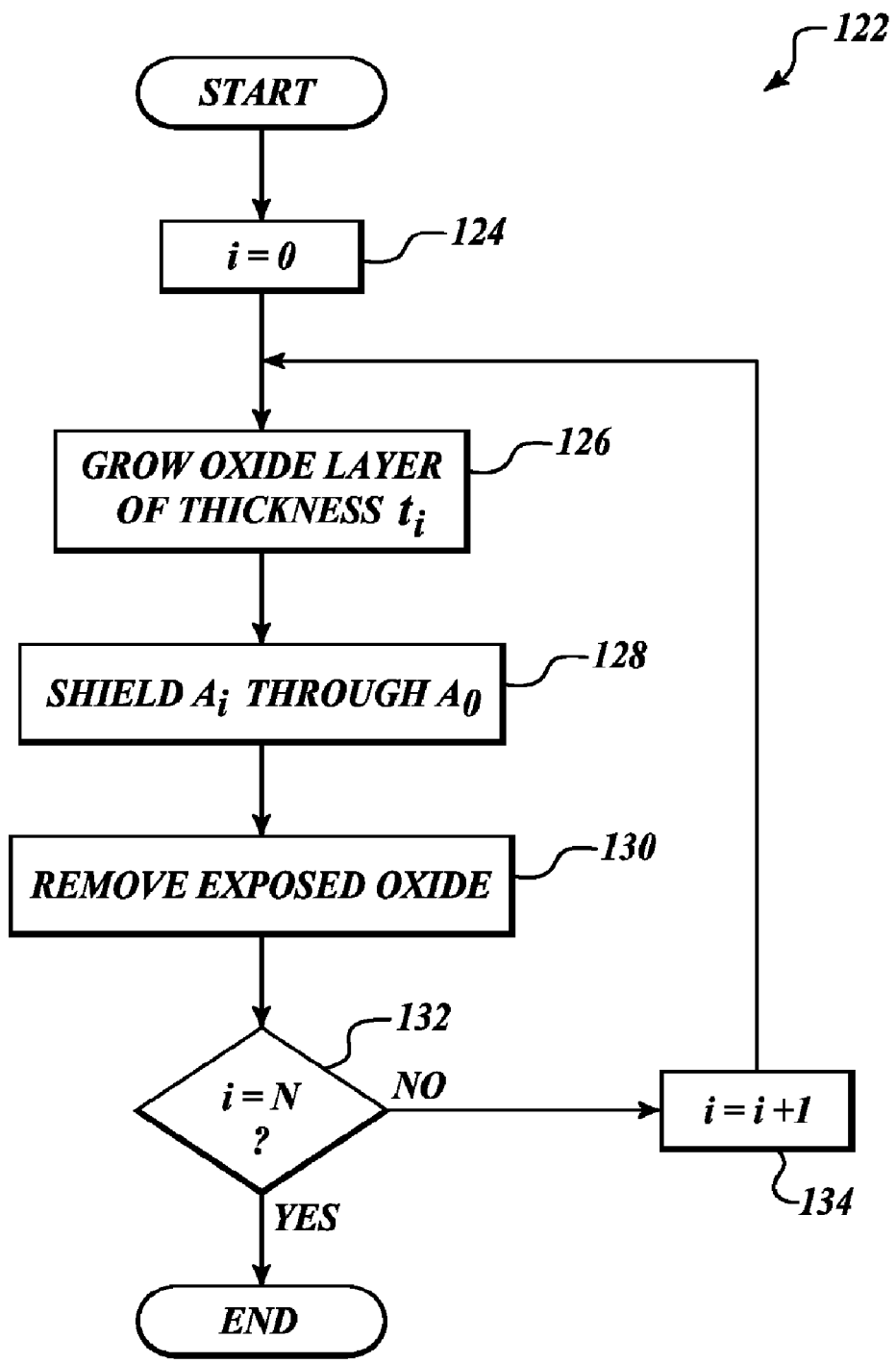
FIG. 16 is a process flow diagram illustrating an alternative method for growing multiple-thickness oxide layers, in accordance with an embodiment of the present invention.

Referring to FIG. 16, the thickness of the oxide layer grown during each iteration need not be the same for each iteration. For example, a silicon substrate 10 may have areas $A_0$ through $A_N$, with $A_0$ having the thickest oxide layer and $A_N$ having the thinnest oxide layer. An area $A_i$ of the areas $A_0$ through $A_N$ need not be contiguous. The difference in thickness between each area $A_i$ and $A_{i+1}$, is $t_i$, except $t_N$ is simply equal to the thickness of the thinnest layer of oxide.

A method 122 for forming a multi-thickness oxide layer includes setting a counter i to zero at block 124. A first oxide layer having a thickness $t_i$ is grown at block 126. At block 128, areas $A_i$ through $A_0$ are shielded. At block 130 oxide is removed from all exposed areas. At block 132, the value of i is compared to variable N representing the total number of thicknesses being formed on the substrate 10. If i is equal to N, the method ends. If i is less than N, than i is incremented at block 134. Areas where no oxide is to be formed are left unshielded during the entire method 122.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the Claims that follow.

What is claimed is:

1. A method for growing layers on a substrate comprising:
    providing a crystalline substrate having first and second facets, the first facet having a faster layer-growth rate than the second facet;
    growing a first layer on the first and second facets;
    removing the first layer from the first facet; and growing a second layer on the first and second facets.

2. The method of claim 1, wherein the first facet is parallel to a 111 plane of the crystalline substrate and wherein the second facet is parallel to a 100 plane of the crystalline substrate.

3. The method of claim 1, wherein the first and second layers comprise an oxide of the crystalline substrate.

4. The method of claim 3, wherein the crystalline substrate is silicon.

5. The method of claim 1, wherein growing the first layer comprises maintaining layer growth conditions for a first period and wherein growing the second layer comprises maintaining layer growth conditions for a second period.

6. The method of claim 5, wherein a first ratio of the second period relative to the sum of the first and second periods is substantially equal to a second ratio of a first growth rate of the second facet relative to a second growth rate of the first facet.

7. The method of claim 5, wherein the first period is of a duration sufficient to grow oxide having a thickness about equal to $S*(1-X/Y)$, where S is a final thickness of oxide grown on the second facet for a total period about equal to a sum of the first and second periods, X is a first growth rate for the second facet, and Y is a second growth rate of the first facet.

8. The method of claim 5, wherein the first period is equal to $t_1$ and the second period is equal to $t_2$ where $t_1$ is equal to $(X_{i(100)}^2)/B + X_{i(100)}/(B/A)$ and $t_2$ is equal to $(X_{o(100)}^2 - X_{i(100)}^2)/B + (X_{o(100)} - X_{i(100)})/(B/A)$ and $(X_{o(111)}^2)/B + X_{o(111)}/(B/A)$ where $X_{i(100)}$ is a thickness of the first layer on the second facet, $X_{o(100)}$ is a thickness of the first and second layers on the second facet, $X_{o(111)}$ is a thickness of the second layer on the first facet, $X_{i(100)} + X_{o(100)}$ and $X_{o(111)}$ are equal, B is equal to a parabolic rate constant corresponding to the layer growth condition, and B/A is a linear rate constant corresponding to the layer growth condition.

9. The method of claim 1, wherein removing the first layer from the first facet comprises:
shielding the second facet;
exposing the crystalline substrate to a layer removing condition adapted to remove the unshielded first layer; and
re-exposing the second facet.

10. The method of claim 9, wherein shielding the second facet comprises:
applying a photoresist compound to the first and second facets;
masking one of the first facet and the second facet to create a masked and an unmasked facet;
exposing the unmasked facet to light; and
removing the photoresist compound from the first facet.

11. The method of claim 9, wherein shielding the second facet comprises depositing a metal layer on the second facet.

12. The method of claim 11, wherein depositing a metal layer on the second facet comprises:
masking the first facet; and
diffusing metal over the crystalline substrate.

13. The method of claim 12, wherein diffusing metal over the crystalline substrate comprises at least one of E-beam, chemical vapor deposition, and sputtering.

* * * * *